(12) United States Patent
Kis et al.

(10) Patent No.: US 9,608,101 B2
(45) Date of Patent: Mar. 28, 2017

(54) SEMICONDUCTOR DEVICE

(75) Inventors: Andras Kis, St-Sulpice (CH); Branimir Radisavljevic, Lausanne (CH)

(73) Assignee: ECOLE POLYTECHNIQUE FEDERALE DE LAUSANNE (EPFL) (CH)

( * ) Notice: Subject to any disclaimer, the term of this patent is extended or adjusted under 35 U.S.C. 154(b) by 0 days.

(21) Appl. No.: 13/976,757

(22) PCT Filed: Jan. 4, 2012

(86) PCT No.: PCT/IB2012/050036
§ 371 (c)(1),
(2), (4) Date: Sep. 13, 2013

(87) PCT Pub. No.: WO2012/093360
PCT Pub. Date: Jul. 12, 2012

(65) Prior Publication Data
US 2014/0197459 A1    Jul. 17, 2014

(30) Foreign Application Priority Data

Jan. 4, 2011 (WO) .................. PCT/IB2011/050021

(51) Int. Cl.
*H01L 29/778* (2006.01)
*H01L 29/66* (2006.01)
*H01L 29/786* (2006.01)

(52) U.S. Cl.
CPC ...... *H01L 29/778* (2013.01); *H01L 29/66742* (2013.01); *H01L 29/78681* (2013.01)

(58) Field of Classification Search
CPC ......... H01L 21/02417; H01L 21/02568; H01L 21/02406; H01L 21/02409; H01L 21/02411; H01L 29/242; H01L 29/24
See application file for complete search history.

(56) References Cited

U.S. PATENT DOCUMENTS 7,242,041 B2 * 7/2007 Bucher et al. ................ 257/289
8,766,330 B2 * 7/2014 Paranjape et al. ............ 257/257
(Continued)

FOREIGN PATENT DOCUMENTS

WO       WO 01/53887 A2       7/2001

OTHER PUBLICATIONS

Mak et al.: "Automically Thin MoS2: A New Direct-Gap Semiconductor", Phys. Rev. Lett., vol. 105, 2010, pp. 136805-1-136805-4; pp. 136805-2, col. 1, paragraph 2.
(Continued)

*Primary Examiner* — Matthew Landau
*Assistant Examiner* — Scott Stowe
(74) *Attorney, Agent, or Firm* — Sheridan Ross P.C.

(57) ABSTRACT

The present invention concerns semiconductor devices comprising a source electrode, a drain electrode and a semiconducting layer consisting of a single or double 2-dimensional layer(s) made from one of the following materials: $MoS_2$, $MoSe_2$, $WS_2$, $WSe_2$, $MoTe_2$ or $WTe_2$. Replacing a stack by only one or two 2-dimensional layer(s) of $MoS_2$, $MoSe_2$, $WS_2$, or $WSe_2$, $MoTe_2$ or $WTe_2$ provides an enhanced electrostatic control, low power dissipation, direct band gap and tunability.

30 Claims, 12 Drawing Sheets

(56) References Cited

U.S. PATENT DOCUMENTS

2007/0181938 A1    8/2007   Bucher et al.
2008/0079075 A1    4/2008   Seon et al.
2010/0102292 A1    4/2010   Hiura et al.

OTHER PUBLICATIONS

International Search Report prepared by the European Patent Office on May 31, 2012, for International Application No. PCT/IB2012/050036.
Written Opinion prepared by the European Patent Office on May 31, 2012, for International Application No. PCT/IB2012/050036.
Official Action for European Patent Application No. 12 708 058.8, dated Feb. 2, 2015, 5 pages.

* cited by examiner

SEMICONDUCTOR DEVICE

CROSS REFERENCE TO RELATED APPLICATIONS

This application is a national stage application under 35 U.S.C. 371 and claims the benefit of PCT Application No. PCT/IB2011/050036 having an international filing date of Jan. 4, 2012, which designated the United States, and which PCT application claimed the benefit of International Application No. PCT/IB2011/050021 filed Jan. 4, 2011, the disclosure of which is incorporated herein by reference.

FIELD OF INVENTION

The present invention relates to semiconductor devices such as transistors or inverters. It more precisely relates to semiconductors comprising a part made of one or two 2-dimensional layers of $MoS_2$, $MoSe_2$, $WS_2$, $WSe_2$, $MoTe_2$, or $WTe_2$.

PRIOR ART

One of the basic building blocks of modern electronics is a field-effect transistor operating as a switch. The operation of FETs with dimensions lower than 50 nm are limited by short channel effects. One of them is the reduction of the height of the tunneling barrier that charge carriers need to overcome when the transistor is supposed to be in its off state, due to a reduction in effectiveness of electrostatic control exercised by the gate electrode. This results in high amounts of power dissipation when the transistor is expected to be off. The use of individual 2-dimensional semiconducting layers can reduce this power dissipation because the 2-dimensional geometry of the semiconducting layer results in improved electrostatic control of the gate electrode and reduction of short channel effects when compared to thick semiconducting layers or stacks of 2-dimensional layers of $MoS_2$, $MoSe_2$, $WS_2$, or $WSe_2$, $MoTe_2$, $WTe_2$. Smallest allowable channel length is proportional to square root of material thickness (L $\sqrt{d}$), so by using a thinner material one can fabricate a transistor with a shorter channel. In the case of single-layer $MoS_2$, 0.65 nm thick, a transistor with a channel 1.5 nm long is still functional.

Another advantage in the use of one or two 2-dimensional layers in FETs lies in the fact that their band gap can be tuned either by a reduction of the number of layers where all the above-mentioned 2-dimensional layers have a direct band gap which is higher than the band gaps of stacks of related materials. This higher band gap leads to further reductions in power dissipation. The size of the band gap can also be tuned using a transverse electric field. Such tuning can result in more efficient transistor switching than in classical FETs.

In order to take a full advantage of the 2-dimensional material, it is advantageous to use a dielectric layer that encapsulates them and which can result in increased charge carrier mobility through physical mechanisms of charge carrier screening, phonon spectrum modification or induced strain. In the example of $MoS_2$, the use of a $HfO_2$ dielectric layer can increase the charge carrier mobility by a factor ~1000.

The use of stacks of 2-dimensional layers of $MoS_2$, $MoSe_2$, $WS_2$, or $WSe_2$, $MoTe_2$, $WTe_2$ have been proposed for FETs for instance in US patent application US2007/181938A1.

FETs using such stacks of 2-dimensional layers are however characterized with several disadvantages such as a low electrostatic control, important power dissipation, absence of a direct band gap and a poor tunability.

There is therefore a need to improve those existing semiconductor devices.

BRIEF DESCRIPTION OF THE DRAWINGS

The present invention may be better understood, and its numerous objects, features and advantages made apparent to those skilled in the art by referencing the accompanying drawings.

GENERAL DESCRIPTION OF INVENTION

The invention concerns a semiconductor device comprising a source electrode, a drain electrode and a semiconducting layer consisting of a single or double 2-dimensional layer(s) made from one of the following materials: $MoS_2$, $MoSe_2$, $WS_2$, $WSe_2$, $MoTe_2$ or $WTe_2$.

Preferred embodiments of the invention are defined in the dependent claims.

Replacing a stack by only one or two 2-dimensional layers of $MoS_2$, $MoSe_2$, $WS_2$, or $WSe_2$, $MoTe_2$, $WTe_2$ provides an enhanced electrostatic control, low power dissipation, direct band gap and tunability. It was shown in Example 1 that a transistor based on a single layer of $MoS_2$ has a room-temperature on/off ratio of $10^8$ and an off-state current of 25 fA/μm. This is because the single 2-dimensional layer has a higher band gap than stacks of 2-dimensional layers and because the gate can more efficiently control conduction due to small thickness of the semiconducting material and result in smaller power consumption. Stacks based on dichalcogenide materials described in patent application US2007/181938A1 have a room-temperature on/off ratio on the order of 10 because of the relatively high thickness of the semiconducting material. Such low on/off ratio implies high power consumption in the off state of the transistor. Using a double 2-dimensional layer retains the advantage of a thin material with the additional benefit that the band gap can be tuned with the application of the external electric field. These advantages are no longer present in structures containing 3 or more 2-dimensional layers.

The advantages of using single or double 2-dimensional layers over using stacks of 2-dimensional layers are not obvious to those familiar with the art. A previously shown example (Novoselov et al., Two-dimensional atomic crystals, PNAS 102, 10451 (2005).) does not exhibit turn-off but only shows a linear dependence of conductivity on bottom gate voltage. Such devices cannot be used as field effect transistors. Mak et al. (Mak et al., Atomically Thin $MoS_2$: A New Direct-Gap Semiconductor, Phys. Rev. Lett. 105, 136805 (2010)) also shows a device that does not turn-off, shows a current modulation by a factor of 100, requiring 160 volts change on the gate electrode which is not practical in devices. All these examples of prior art do invite the use of single 2-dimensional layers in transistor and do not show that using single 2-dimensional layers has advantages over using stacks of 2-dimensional layers.

Figure 1A:
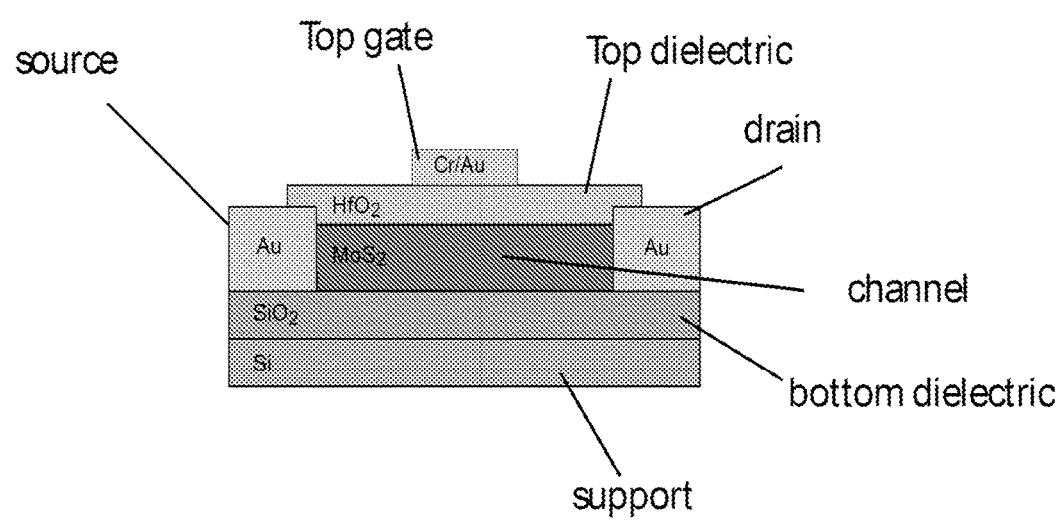
FIG. 1A depicts a schematic non-limitative representation of a single0layer $MoS_2$ transistor according to the invention.

FIG. 1A is a schematic non-limitative representation of a single-layer $MoS_2$ transistor according to the invention.

Figure 1B:
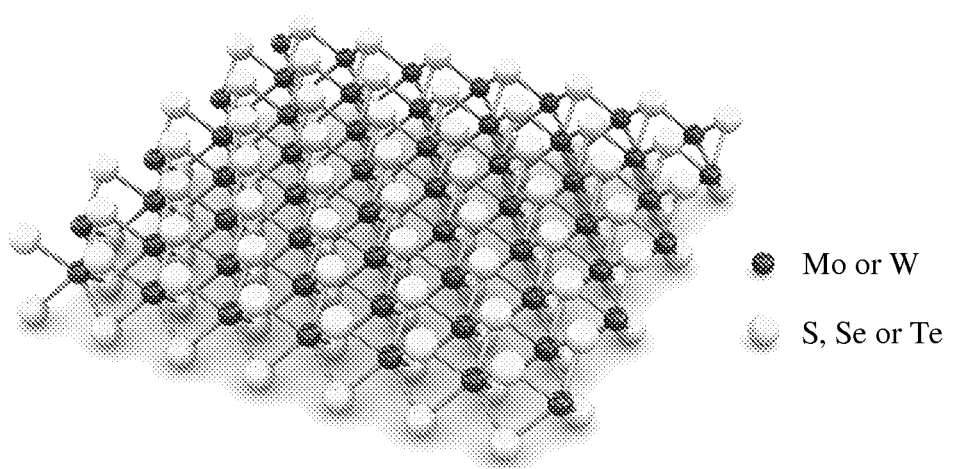
FIG. 1B illustrates the structure of a single two-dimensional layer of $MoS_2$.

FIG. 1B illustrates the structure of a single two-dimensional layer of $MoS_2$.

Alternatively the single $MoS_2$ layer may be replaced a layer made of $MoSe_2$, $WS_2$, or $WSe_2$, $MoTe_2$, $WTe_2$. Two 2-dimensional layers may also be used.

Source, drain and top gate electrodes may be made of any electrical conductor, including graphene.

The dielectric layer may be made of any electrically insulating material, including boron-nitride and single-layer boron nitride.

In one embodiment of the invention a bottom dielectric layer may be used, such a layer being made of any electrically insulating material, including boron-nitride and single-layer boron nitride.

The bottom dielectric layer may be omitted if using an electrically insulating substrate.

Substrate may be made of any suitable flat material, solid or flexible; at least: glass, sapphire, kapton, polyimide.

DETAILED DESCRIPTION OF THE INVENTION

The invention will be better understood below, in particular with the use of some non-limiting examples.

The semiconductor device according to the invention may be manufactured by one of the following processes:

a) Liquid phase exfoliation—this is the method developed by the Oxford-Trinity college collaboration (Coleman et al., Two-Dimensional Nanosheets Produced by Liquid Exfoliation of Layered Materials, Science 331, 568 (2011). It consists of suspending particles of the material in organic solvents, agitating using solvents using ultrasound and purifying using centrifugation. These solvents can then be sprayed over surfaces or deposited on substrates using the Langmuir-Blodgett technique (Divigalpitiya et al., Thin oriented films of molybdenum disulphide, Thin Solid Films 186, 177 (1990)). This may be the method of choice for applications in cheap, bendable electronics.

b) Molecular beam epitaxy—elements (Mo and Se for example) are simultaneously evaporated in ultrahigh vacuum onto heated substrates. High quality, continuous films can be grown on large areas (cm×cm or larger). (Ueno et al., Epitaxial-Growth of Transition-Metal Dichalcogenides on Cleaved Faces of Mica, Journal of Vacuum Science & Technology A 8, 68 (1990)).

c) Chemical vapour transport—either elements (Mo, Se, Te, S, W) or powders (for example $MoSe_2$) are sublimated in closed ampoules with a warmer and a colder region. Crystals deposit and grow in the colder part of the tube (Enomoto et al., Van der Waals growth of thin $TaS_2$ on layered substrates by chemical vapor transport technique, Jpn. J. Appl. Phys. 43, L123 (2004)).

d) Chemical vapour deposition—mixture of gasses flow past a heated catalyst surface. A chemical reaction occurs on the surface, resulting in film growth (Boscher et al., Atmospheric Pressure CVD of Molybdenum Diselenide Films on Glass, Chemical Vapor Deposition 12, 692 (2006)).

In addition to the basic structure shown on FIG. 1A the semiconductor device according to the present invention may be made according to other geometries.

Figure 2A:
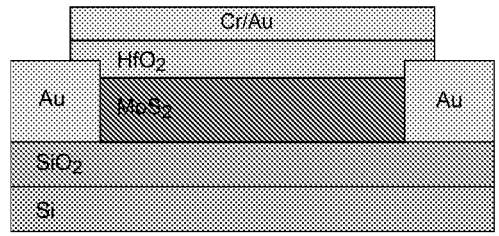
FIG. 2A depicts a semiconductor device in accordance with an embodiment of the present disclosure.

Some non-limitative examples of such geometries are presented in FIGS. 2A to 2I wherein:

FIG. 2A shows a top gate electrode which extends over the other electrodes.

Figure 2B:
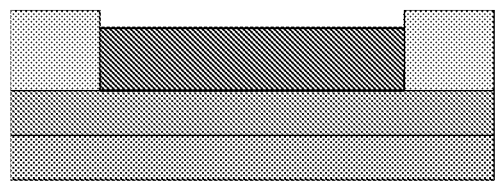
FIG. 2B depicts a semiconductor device in accordance with an embodiment of the present disclosure.

The device of FIG. 2B has no top gate electrode or top oxide. It can be used as a chemical, biological or pH sensor.

Figure 2C:
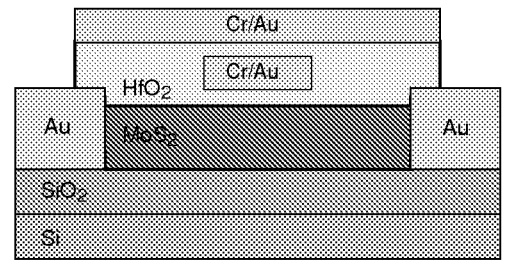
FIG. 2C depicts a semiconductor device in accordance with an embodiment of the present disclosure.

In the device of FIG. 2C the top gate electrode is embedded in gate oxide.

Figure 2D:
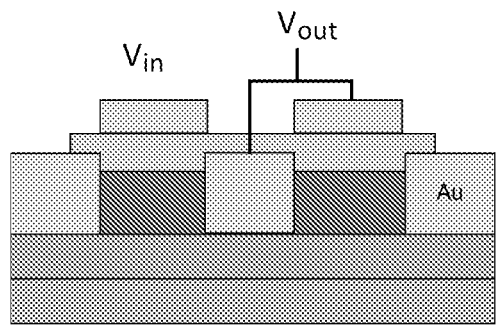
FIG. 2D depicts a semiconductor device in accordance with an embodiment of the present disclosure.

The device of FIG. 2D comprises two transistors connected in series (logic inverter).

Figure 2E:
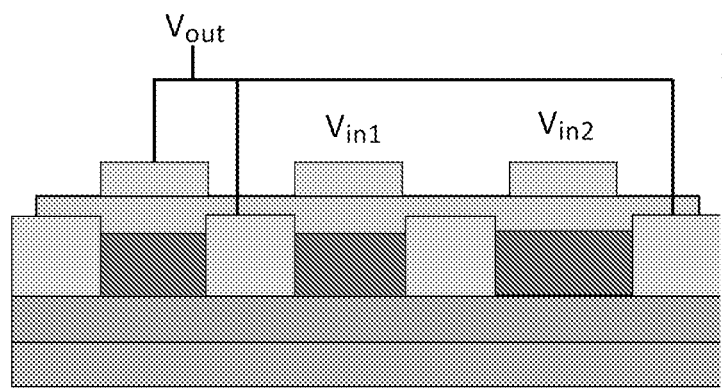
FIG. 2E depicts a semiconductor device in accordance with an embodiment of the present disclosure.

The device of FIG. 2E comprises three transistors connected in series (logic NOR).

Figure 2F:
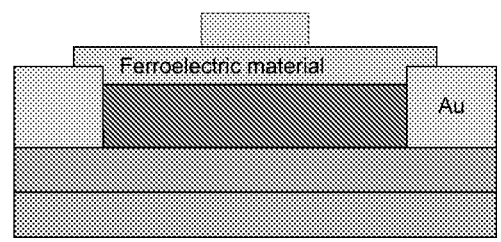
FIG. 2F depicts a semiconductor device in accordance with an embodiment of the present disclosure.

In the device of FIG. 2F the gate oxide is replaced with a ferroelectric material (non-volatile memory).

Figure 2G:
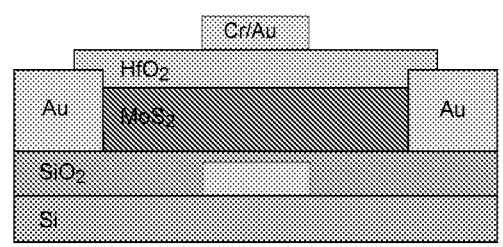
FIG. 2G depicts a semiconductor device in accordance with an embodiment of the present disclosure.

The device of FIG. 2G shows an additional buried gate electrode, a better electrostatic control and tenability of the band gap in the case where two 2-dimensional layers are used as a semiconducting material.

Figure 2H:
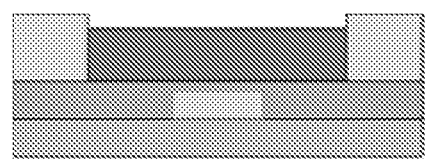
FIG. 2H depicts a semiconductor device in accordance with an embodiment of the present disclosure.

The device of FIG. 2H contains a buried gate electrode, has no top gate or top oxide and can therefore be used as a sensor.

Figure 2I:
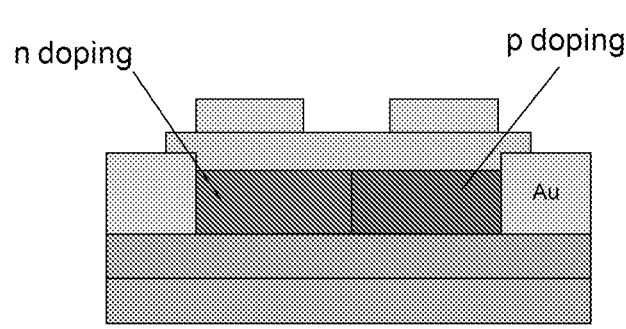
FIG. 2I depicts a semiconductor device in accordance with an embodiment of the present disclosure.

The device of FIG. 2I has two transistors in series and a junction with n and p-type doping. It can be used as LED.

Figure 3:
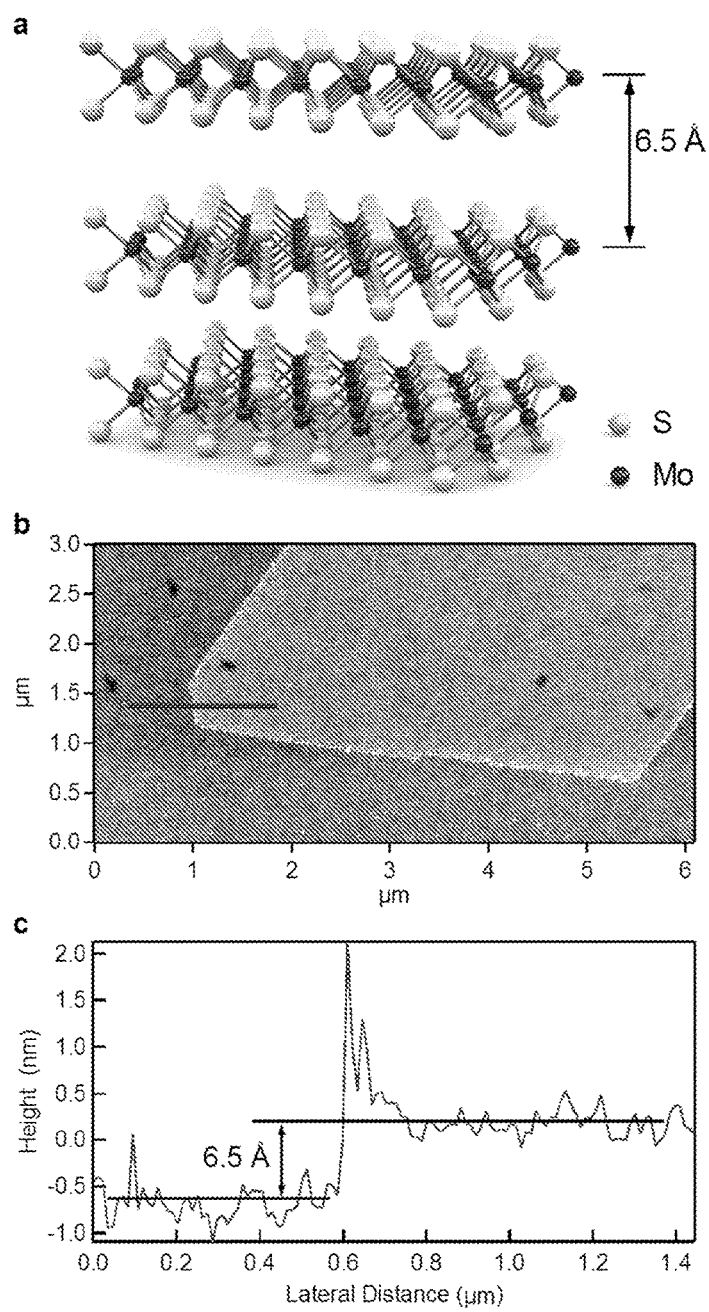
FIG. 3 illustrates a structure and AFM imaging of monolayer $MoS_2$ in accordance with an embodiment of the present disclosure.

FIG. 3 shows the structure and AFM imaging of monolayer $MoS_2$. a Three-dimensional representation of the structure of MoS2. Single layers, 6.5 Å thick can be extracted using scotch-tape based micromechanical cleavage. b Atomic force microscope image of a single layer of MoS2 deposited on Si substrate with a 270 nm thick oxide layer. c Cross-section plot along the red line in part b.

Figure 4:
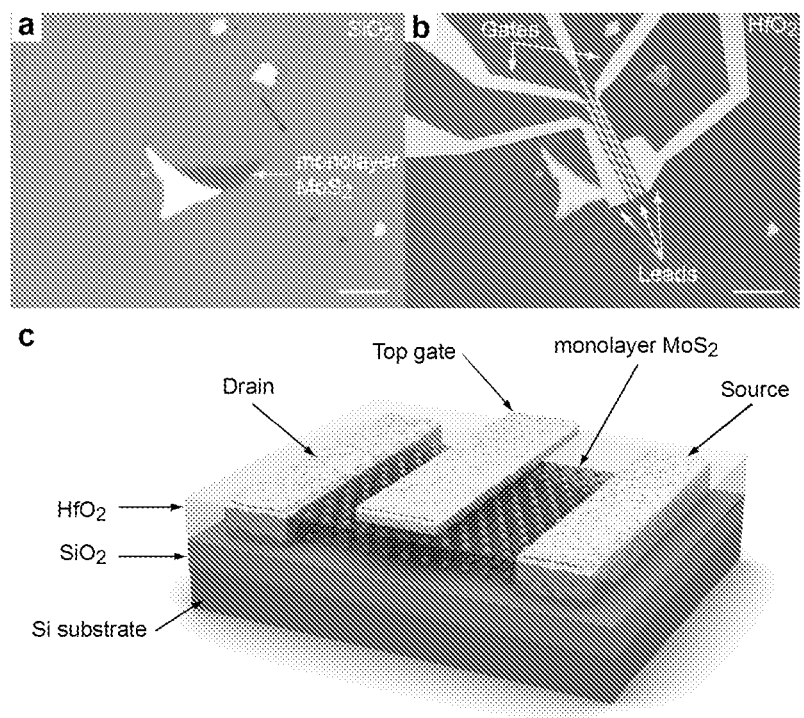
FIG. 4 depicts fabrication of transistors in accordance with an embodiment of the present disclosure.

FIG. 4 shows the fabrication of $MoS_2$ monolayer transistors. a Optical image of a single layer of $MoS_2$ with a thickness of 6.5 Å deposited on top of a Si substrate with a 270 nm thick $SiO_2$ layer. b Optical image of a device based on the flake shown on figure a. The device consists of two field effect transistors connected in series and defined by three Au leads that serve as source and drain electrodes for the two transistors. Monolayer $MoS_2$ is covered by 30 nm of ALD deposited $HfO_2$ that acts both as a gate dielectric and a mobility booster. The scale bars in a and b are 10 μm long. c Three-dimensional schematic view of one of the transistors shown on figure b.

Figure 5:
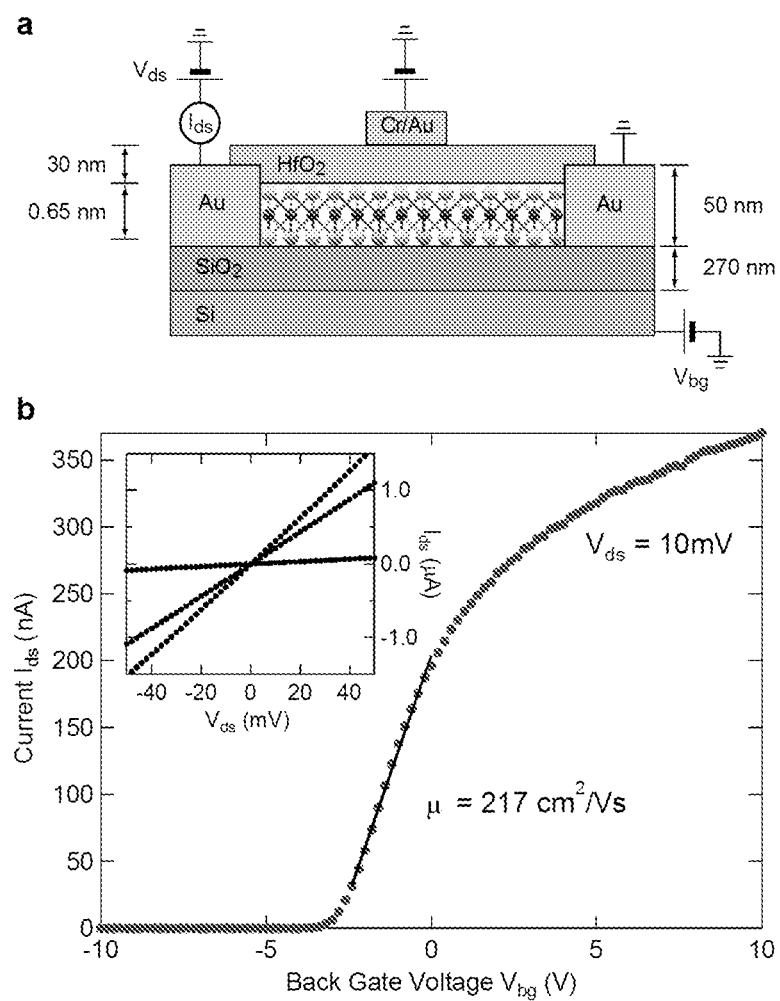
FIG. 5 depicts a cross-sectional view of a structure of monolayer $MoS_2$ FET in accordance with an embodiment of the present disclosure.

FIG. 5 shows characterization of $MoS_2$ monolayer transistors. a Cross-sectional view of the structure of monolayer $MoS_2$ FET together with electrical connections used to characterize the device. Single layer of $MoS_2$ 6.5 Å thick is deposited on degenerately doped Si substrate with 270 nm thick $SiO_2$. The substrate acts a back gate. One of the gold electrodes acts as drain while the other, source electrode is grounded. The monolayer is separated from the top gate by 30 nm of ALD-grown $HfO_2$. The top gate width for device is 4 μm while the top gate length, source-gate and gate-drain spacing is 500 nm. b Room temperature transfer characteristic for the FET with 10 mV applied bias voltage $V_{ds}$. Back gate voltage $V_{bg}$ is applied to the substrate and the top gate is disconnected. The inset shows an $I_{ds}$-$V_{ds}$ curve acquired for $V_{bg}$ values of 0.1 and 5 V.

Figure 6:
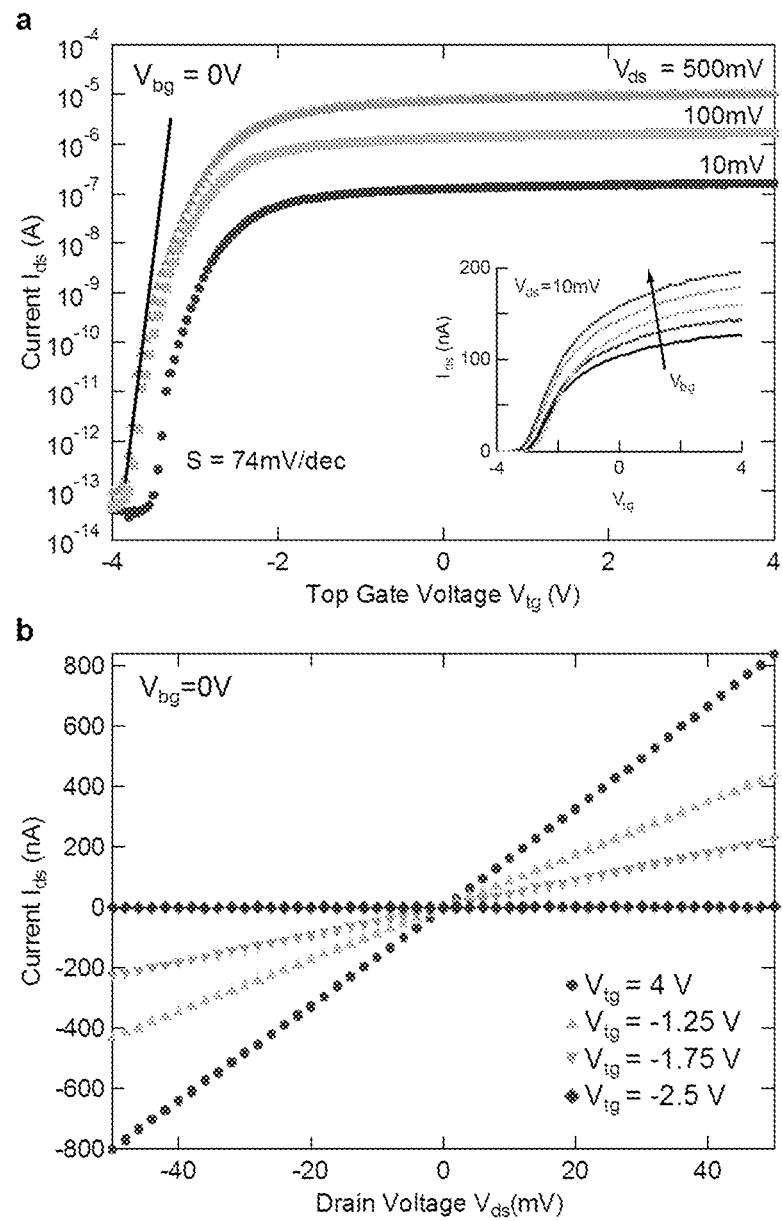
FIG. 6 depicts local gate control of a transistor in accordance with an embodiment of the present disclosure.

FIG. 6 shows local gate control of the $MoS_2$ monolayer transistor. a $I_{ds}$-$V_{tg}$ curve recorded for a bias voltages ranging from 10 mV to 500 mV. Measurements are performed at room temperature with the back gate grounded. Top gate width is 4 μm while the top gate length is 500 nm. The device can be completely turned off by changing the top gate bias from −2 to −4 V. For $V_{ds}$=10 mV, the $I_{On}/I_{Off}$ ratio is >1×10$^6$. For $V_{ds}$=500 mV, the $I_{On}/I_{Off}$ ratio is >1×10$^8$ in the measured range while the subthreshold swing S=74 mV/dec. Top and bottom gate leakage is negligible (Fig. S3 in supplementary materials). Inset shows $I_{ds}$-$V_{tg}$ for values of $V_{bg}$=−10,−5,0,5 and 10 V. b $I_{ds}$-$V_{ds}$ curves recorded for different values of the top gate voltage $V_{tg}$. The linear dependence of the current on bias voltage for small voltages indicates that the Au contacts are ohmic.

Figure 7:
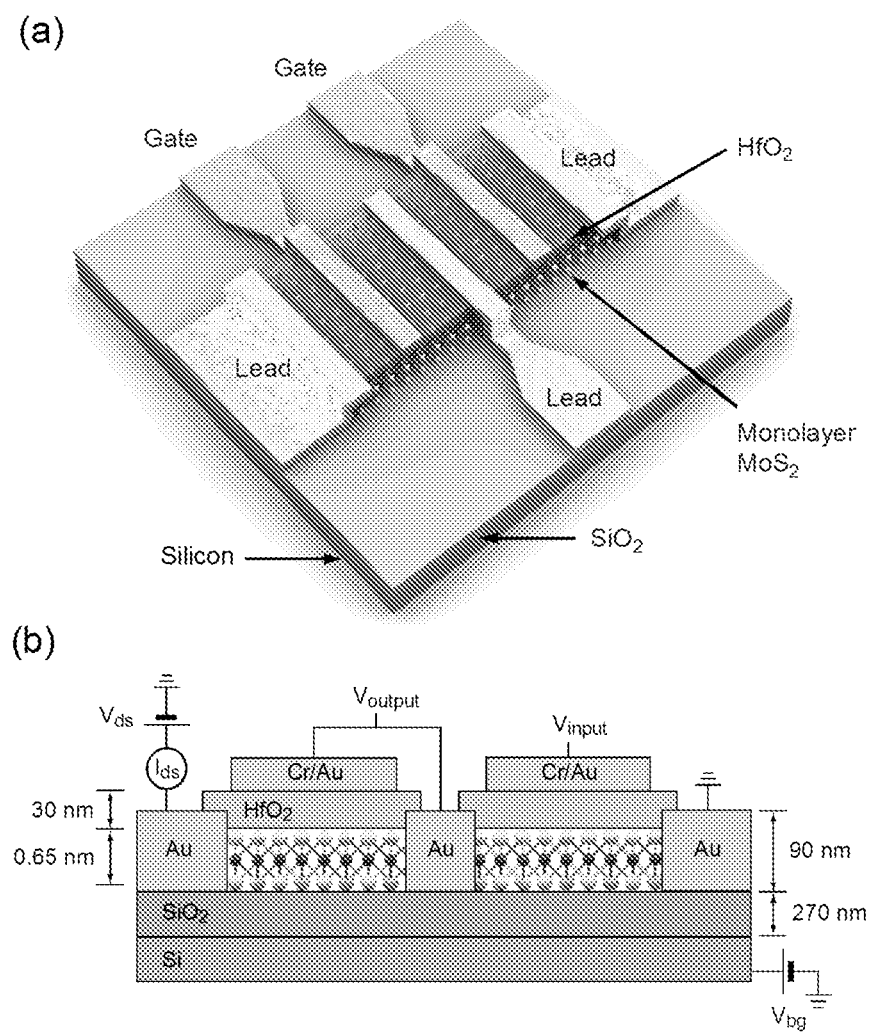
FIG. 7 depicts an integrated circuit based on an embodiment of the present disclosure.

FIG. 7 shows an integrated circuit based on single-layer $MoS_2$ (not to scale). (a) Single-layer $MoS_2$ is deposited on top of a Si chip covered with 270 nm thick $SiO_2$. The integrated circuit is composed of two transistors defined by a neighboring pair of leads and controlled by local gates with $HfO_2$ gate dielectric. (b) Cross-sectional view of the structure of a monolayer $MoS_2$ integrated circuit together with electrical connections used to characterize the device. One of the gold electrodes acts as drain while the other, source electrode is grounded. The monolayer is separated from the top gate by 30 nm of ALD-grown $HfO_2$. The top gate width for device is 4.7 μm, top gate length is 1.3 μm and lead spacing is 1.6 μm. The substrate can act as a back gate but is kept grounded during the measurement.

Figure 8:
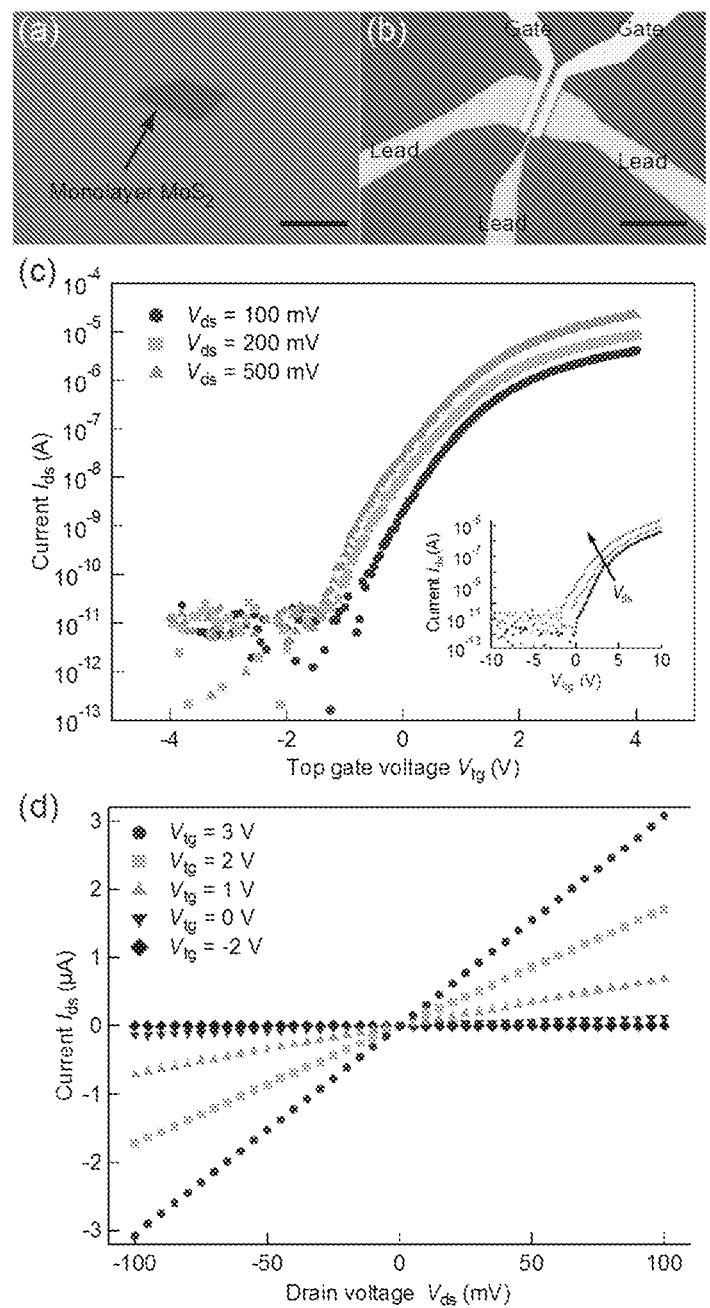
FIG. 8 depicts electrical characterization of an integrated circuit based on an embodiment of the present disclosure.

FIG. 8 shows electrical characterization of the integrated circuit based on monolayer $MoS_2$. (a) Optical image of a monolayer $MoS_2$ deposited on top of a Si substrate with a 270 nm thick $SiO_2$ layer. (b) Integrated circuit based on the flake shown in (a). The device consists of three Au electrical leads that can act as source, drain and output terminals and two local gates. The scale bars in (a) and (b) are 10 μm long. (c) Drain-source current $I_{ds}$ through the $MoS_2$ monolayer transistor on the left side of the integrated circuit shown on b, measured as a function of the top gate voltage $V_{tg}$. The $MoS_2$ transistor shows gating response typical of FETs with n-type conducting channels. Inset shows the drain-source current $I_{ds}$ as a function of back gate voltage $V_{bg}$ for drain-source voltage $V_{ds}$ values of 100 mV, 200 mV and 500 mV. (d) Drain-source current $I_{ds}$ as a function of drain-source voltage for different values of $V_{tg}$. The current through the device changes by over six orders of magnitude when the top gate voltage is swept in the −4V to +4V range.

Figure 9:
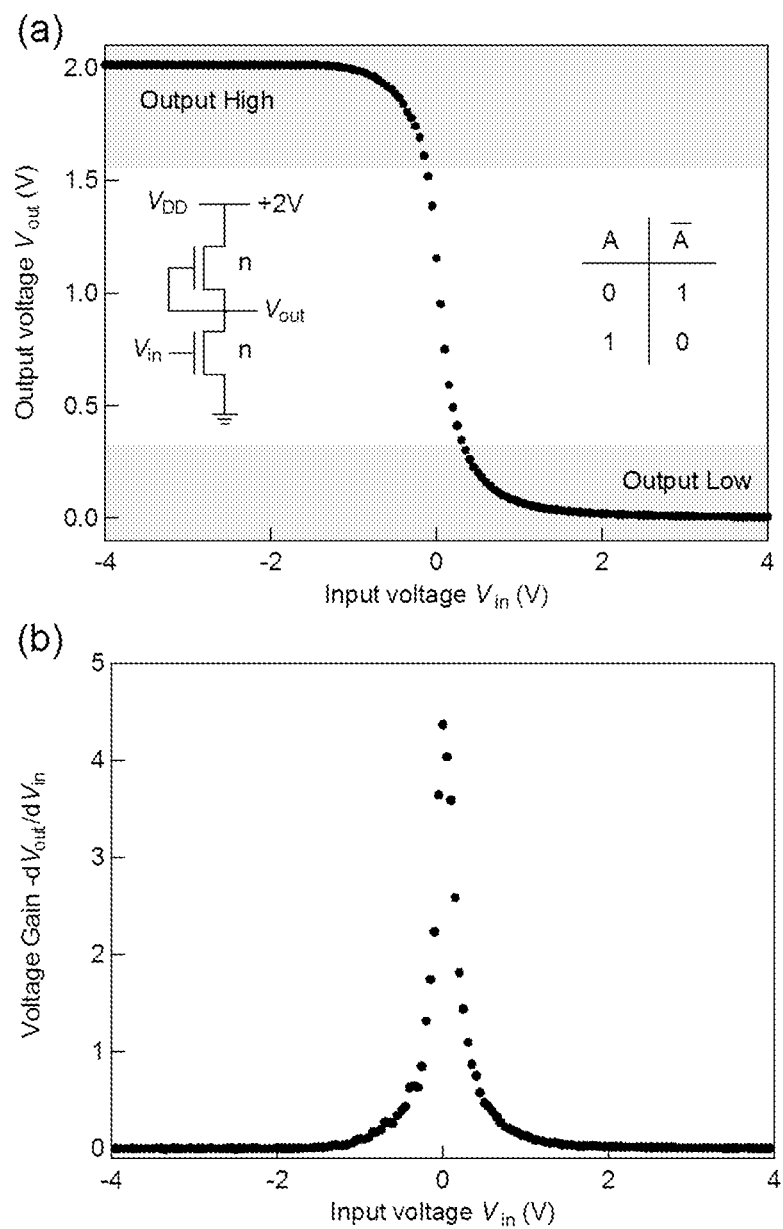
FIG. 9 depicts characteristics of an integrated $MoS_2$ inverter in accordance with an embodiment of the present disclosure.

FIG. 9 shows characteristics of the integrated $MoS_2$ inverter. (a) Output voltage as a function of the input voltage. Schematic drawing of the electronic circuit and the truth table for the NOT logic operation (Inset). (b) The dependence of the inverter gain (negative value of $dV_{out}/dV_{in}$) on the input voltage. The maximal voltage gain above 4 indicates that our inverter is suitable for integration in arrays of logic devices.

Figure 10:
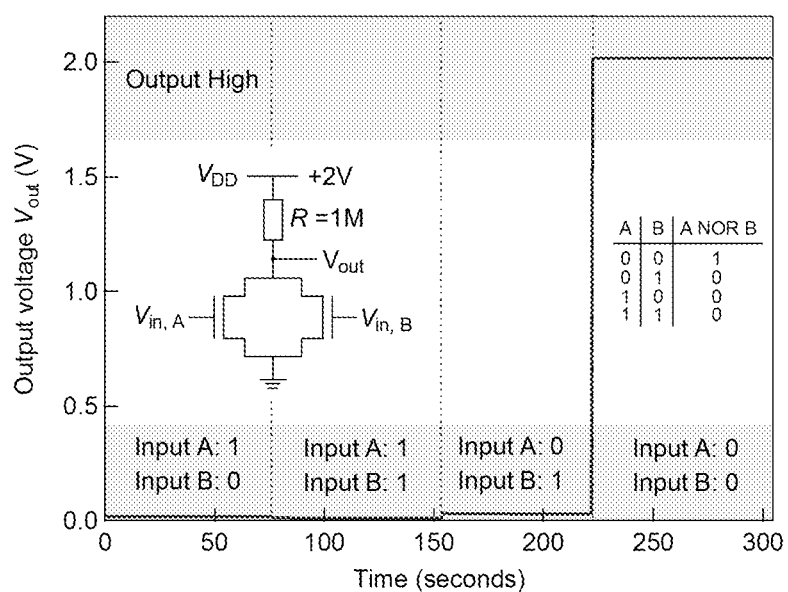
FIG. 10 depicts a demonstration of a NOR gate logic circuit based on an embodiment of the present disclosure.

FIG. 10 shows the demonstration of a NOR-gate logic circuit based on single-layer $MoS_2$ transistors. The circuit is formed by connecting two monolayer $MoS_2$ transistors in parallel and using an external 1 MOhm resistor as a load (left inset). The output voltage $V_{out}$ is shown for four different combinations on input states (1,0), (1,1), (0,1) and (0,0). The output is at the high state only if both inputs are in the low state (truth table in the inset). All logic operations can be expressed as combinations of NOR operations.

Two detailed non-limitative examples according to the present invention are presented in the following chapters.

Example 1

Transistor Based on a Single 2-Dimensional Layer of $MoS_2$

Two-dimensional materials are attractive for use in next-generation nanoelectronic devices because, compared to one-dimensional materials, it is relatively easy to fabricate complex structures from them. The most widely studied two-dimensional material is graphene,[1,2] both because of its rich physics[3-5] and its high mobility.[6] However, pristine graphene does not have a band gap, which is required for many applications including transistors,[7] and engineering a graphene bandgap increases fabrication complexity and either reduces mobilities to the level of strained silicon films[8-13] or requires high voltages.[14,15] While single layers of $MoS_2$ have a large intrinsic bandgap of 1.8 eV[16], previously reported mobilities in the 0.5-3 cm$^2$/Vs range[17] are too low for practical devices. Here we use a halfnium oxide gate dielectric to demonstrate a room-temperature single-layer $MoS_2$ mobility of at least 200 cm$^2$/Vs, similar to that of graphene nanoribbons, and demonstrate transistors with room temperature current on/off ratios of 10$^8$ and ultralow stand-by power dissipation. Because monolayer $MoS_2$ has a direct bandgap[16,18] it can be used to construct inter-band tunnel FETs[19], which offer lower power consumption than classical transistors. Monolayer $MoS_2$ could also complement graphene in applications that require thin transparent semiconductors—for example in optoelectronics and energy harvesting.

$MoS_2$ is a typical example from the layered transition metal dichalcogenide family of materials. Crystals of $MoS_2$ are composed of vertically stacked, weakly interacting layers held together via van der Waals interaction, FIG. 3a. Single layers, 6.5 Å thick (FIGS. 3b and 3c), can be extracted by means of scotch tape[17,23] or lithium-based intercalation.[24,25] Large-area thin films can also be prepared using $MoS_2$ suspensions. Bulk $MoS_2$ is semiconducting with an indirect band gap of 1.2 eV,[26] while single-layer $MoS_2$ is a direct gap semiconductor[16,18] with a band gap of 1.8 eV.[16] $MoS_2$ nanotubes[27] and nanowires[28] also show the influence of quantum-mechanical confinement in their electronic and optical properties. Other features that could make $MoS_2$ interesting for nanoelectronic applications include the absence of dangling bonds and thermal stability up to 1100° C.

Single-layer $MoS_2$ could also be interesting as a semiconducting analogue of graphene that does not have a band gap in its pristine form. Band gaps up to 400 meV have been introduced by quantum mechanical confinement in patterned[20] or exfoliated graphene nanoribbons[9] but always at the price of significant mobility reduction (200 cm$^2$/Vs for a 150 meV band gap),[9,10] loss of coherence[11] or increased off-state currents due to edge roughness.[12] Band gaps were also induced by applying a perpendicular electric field in bilayer graphene,[14,21] but the highest reported optical gap here is 250 meV, requiring application of voltage exceeding 100V.[14] This makes it very difficult to build logic circuits based on graphene that would operate at room temperature with low stand-by power dissipation. In fact, any potential replacement of silicon in CMOS-like digital logic devices is desired to have a current on/off ratio[7] $I_{on}/I_{off}$ between $10^4$ and $10^7$ and a band gap exceeding 400 meV.[22]

The starting point for the fabrication of our transistors is scotch-tape based micromechanical exfoliation[1,17] of single-layer $MoS_2$. $MoS_2$ monolayers are transferred to degenerately doped Si substrates covered with 270 nm thick $SiO_2$, FIG. 4a. We have previously found that this oxide thickness is optimal for optical detection of single-layer $MoS_2$ and established the correlation between contrast and thickness as measured by atomic force microscopy.[29] Electrical contacts are first fabricated using electron beam lithography followed by deposition of 50 nm thick Au electrodes. The device is then annealed at 200° C. in order to remove resist residue[30] and decrease contact resistance (please refer to the supplementary material for more details). At this point our single-layer devices show typical mobility in the 0.1-10 cm$^2$V/s range, similar to previously reported values for single-layers[17] and thin crystals containing more than 10 layers of $MoS_2$.[31] This is lower than the previously reported phonon-scattering limited room temperature mobility in the 200-500 cm$^2$/Vs range for bulk $MoS_2$.[32] Encouraged by recent theoretical predictions of mobility improvement by dielectric screening[33] and its successful application to graphene,[34] we proceed by atomic layer deposition of 30 nm $HfO_2$ as a high-κ gate dielectric for the local top gate and mobility booster in order to realize the full potential of single-layer $MoS_2$. We chose $HfO_2$ because of its high dielectric constant of 25, band gap of 5.7 eV and the fact that it is commonly used as a gate dielectric both by the research community and major microprocessor manufacturers.[35,36] The resulting structure, composed of two field-effect transistors connected in series is shown on FIG. 4b with the schematic depiction of the device shown on FIG. 4c. The top gate width for our device is 4 μm while the top gate length, source-gate and gate-drain spacing is 500 nm.

We perform electrical characterization of our device at room temperature using a semiconductor parameter analyzer and shielded probe station with voltage sources connected in the configuration depicted on FIG. 5a. We first characterize our $MoS_2$ transistors with 6.5 Å thick conductive channels by applying a drain-source bias $V_{ds}$ to a pair of Au electrodes and gate voltage $V_{bg}$ to the degenerately doped Si substrate while leaving the top gate electrically floating.[37] The gating characteristics of the left-most transistor shown on FIG. 4b is presented on FIG. 5b and is typical of FET devices with an n-type channel. We concentrate on this device in the remainder of the manuscript. Characterization details for other devices and fabrication batches are available in the supplementary material. All the $MoS_2$ transistors we have fabricated, regardless of the number of layers or contacting material, show behavior typical of FET devices with n-type channels. Repeated $V_{bg}$ sweeps on the same device do not show significant variation, while keeping all the voltages constant results in constant $I_{ds}$, indicating that the top gate is not likely to accumulate charge during measurements. We estimate that a constant surface charge n≈4.6×10$^{12}$ cm$^{-2}$ trapped on the top gate would shift the threshold voltage by ~1V but not change the slope of the $I_{ds}$-$V_{bg}$ curve on FIG. 5b used for estimating channel mobility. The source current versus source bias characteristics, FIG. 5b inset, is linear in the ±50 mV range of voltages, indicating that our Au contacts are ohmic.

The on-resistance of our transistor is 27 kΩ for $V_{ds}$=10 mV and $V_{bg}$=10 V with the gate width of 4 μm and bottom gate length of 1.5 μm. We have noticed that the device resistance can increase during storage at ambient conditions for a period of two months. This could be attributed to absorption of oxygen and/or water from the environment and could be mitigated by device encapsulation.

From the data presented on FIG. 5b we can extract the low-field field effect mobility of ~217 cm$^2$/Vs using the expression $\mu=[dI_{ds}/dV_{bs}]\times[L/(WC_iV_{ds})]$ where L=1.5 μm is the channel length, W=4 μm channel width and $C_i$=1.3×10$^{-4}$ F/m$^2$ is the capacitance between the channel and the back gate per unit area ($C_i=\epsilon_0\epsilon_r/d$; $\epsilon_r$=3.9; d=270 nm). Note that this value represents the lower limit because of contact resistance. As our device displays ohmic $I_{ds}$-$V_{ds}$ behavior, FIG. 5b inset, we exclude the possibility that our field-effect behavior is dominated by Schottky barriers at the contacts.

Even though the room-temperature value of phonon-scattering limited[32] mobility for bulk $MoS_2$ is in the 200-500 cm$^2$/Vs range, exfoliation of single layers onto $SiO_2$ results in a decrease of mobility down to the 0.1-10 cm$^2$V/s range. The improvement of the mobility with the deposition of a high-κ dielectric could be due to suppression of Coulomb scattering due to the high-κ dielectric environment[33] and modification of phonon dispersion[38] in $MoS_2$ monolayers. Extensive future theoretical work including calculation of phonon dispersion relation in single-layer $MoS_2$, calculation of scattering rates on phonons and charge impurities would be needed to provide a complete picture.

Before we compare the value of mobility in our case with the mobility of graphene or thin-film Si we should note that semiconductors such as carbon nanotubes or graphene nanoribbons mostly follow the general trend of decreasing mobility with increasing band gap.[22] Even though graphene has a high room temperature mobility of 120000 cm$^2$/Vs, this value relates to large-area, gapless graphene.[6] On the other hand, measurements on 10 nm wide graphene nanoribbons with Eg~400 mV indicate mobility lower than 200 cm$^2$/Vs,[9] in good agreement with theoretical models that predict decreased mobility in small-width GNR due to electron-phonon scattering.[13] This is comparable to mobility of 250 cm$^2$/Vs found in 2 nm thin strained Si films.[42] Our $MoS_2$ monolayer has similar mobility but higher band gap than graphene nanoribbons[9] and a smaller thickness than thinnest Si films fabricated to date.[42]

One of the crucial requirements for building integrated circuits based on single layers of $MoS_2$ is the ability to control charge density in a local manner, independently of a global back gate. We can do this by applying a voltage $V_{tg}$ to the top gate, separated from the monolayer $MoS_2$ by 30 nm of $HfO_2$, FIG. 5a, while keeping the substrate grounded. The corresponding transfer characteristic is shown on FIG. 6a. For a bias of 10 mV we observe an on current of 150 nA (37 nA/μ), current on/off ratio $I_{on}/I_{off}$>10$^6$ for the ±4 V range of $V_{tg}$, an off state current that is smaller than 100 fA (25 fA/μm) and gate leakage lower than 2 pA/μm². The observed current variation for different values of $V_{tg}$ indicates that the field-effect behavior of our transistor is dominated by the $MoS_2$ channel and not the contacts.

At the bias voltage $V_{ds}$=500 mV, the maximal measured on current is 10 μA (2.5 μA/μm), with $I_{on}/I_{off}$ higher than $10^8$ for the ±4 V range of $V_{tg}$. The device transconductance defined as $g_m$=$dI_{ds}/dV_{tg}$ at $V_{ds}$=500 mV is ~4 μS (1 μS/μm), similar to values obtained for high performance CdS nanoribbon array transistors (2.5 μS/μm at $V_{ds}$=1 V).[43] High-performance top-gated graphene transistors can have normalized transconductance values as high as 1.27 mS/μm.[44] The large degree of current control in our device is also clearly illustrated on FIG. 6b. where we plot the drain-source current versus drain-source bias for different values of voltage applied to the local gate. From the channel current dependence on top-gate voltage, we deduce a subthreshold slope for the transition between the on and off states of 74 mV/dec for a bias $V_{ds}$=500 mV. Being a direct gap semiconductor, single layers of $MoS_2$ offer the intriguing possibility for the realization of an interband tunnel FETs which is characterized by turn-on sharper than the theoretical limit of 60 mV/dec for classical transistors and consequently smaller power dissipation. This feat has remained difficult in case of silicon, an indirect gap semiconductor, because interband transitions there require phonons and recombination centers.

To summarize, we have realized a field-effect transistor with a single, two-dimensional layer of a semiconductor $MoS_2$ as a conductive channel and hafnium dioxide as a gate insulator. The conductive channel in our device is only 6.5 Å thick. Our transistor exhibits a room temperature current on/off ratio exceeding 1×10⁸ and mobility of ~200 cm²/Vs, comparable to mobility achieved in thin silicon films[42] or graphene nanoribbons.[9] Such a transistor could form the backbone of future electronics based on layered materials where $MoS_2$ transistors could be fabricated on insulating boron-nitride substrates.[40] Our results provide an important step towards the realization of electronics and low stand-by power integrated circuits based on two-dimensional materials. Being a thin, transparent semiconducting material, $MoS_2$ monolayers also present a wealth of new opportunities in areas that include mesoscopic physics, optoelectronics and energy harvesting. With the possibility to fabricate large areas circuits using solution-based processing, our finding could be important for producing electronic devices that could combine the ease of processing associated with organic conductors with performance figures commonly associated with Si-based electronics.

Materials and Methods

Single layers of $MoS_2$ are exfoliated from commercially available crystals of molybdenite (SPI Supplies Brand Moly Disulfide) using the scotch-tape micromechanical cleavage technique method pioneered for the production of graphene.[1] AFM imaging is performed using the Asylum Research Cypher AFM. After Au contact deposition, devices are annealed in 100 sccm of Ar and 10 sccm $H_2$ flow at 200 C for 2 h.[30] ALD is performed in a home-built reactor using a reaction of $H_2O$ with tetrakis(dimethylamido)hafnium (Sigma Aldrich). Electrical characterization is carried out using Agilent E5270B parameter analyzer and a home-built shielded probe station with micromanipulated probes.

REFERENCES TO EXAMPLE 1

1 Novoselov, K. S. et al. Electric Field Effect in Atomically Thin Carbon Films. *Science* 306, 666-669, (2004).

2 Berger, C. et al. Ultrathin Epitaxial Graphite: 2D Electron Gas Properties and a Route toward Graphene-based Nanoelectronics. *J. Phys. Chem. B* 108, 19912-19916, (2004).

3 Novoselov, K. S. et al. Two-dimensional gas of massless Dirac fermions in graphene. *Nature* 438, 197-200, (2005).

4 Zhang, Y., Tan, Y.-W., Stormer, H. L. & Kim, P. Experimental observation of the quantum Hall effect and Berry's phase in graphene. *Nature* 438, 201-204, (2005).

5 Du, X., Skachko, I., Duerr, F., Luican, A. & Andrei, E. Y. Fractional quantum Hall effect and insulating phase of Dirac electrons in graphene. *Nature* 462, 192-195, (2009).

6 Bolotin, K. I. et al. Ultrahigh electron mobility in suspended graphene. *Solid State Communications* 146, 351-355, (2008).

7 The International Technology Roadmap for Semiconductors. (2009).

8 Han, M. Y., Ozyilmaz, B., Zhang, Y. & Kim, P. Energy Band-Gap Engineering of Graphene Nanoribbons. *Phys. Rev. Lett.* 98, 206805, (2007).

9 Li, X., Wang, X., Zhang, L., Lee, S. & Dai, H. Chemically Derived, Ultrasmooth Graphene Nanoribbon Semiconductors. *Science* 319, 1229-1232, (2008).

10 Jiao, L., Zhang, L., Wang, X., Diankov, G. & Dai, H. Narrow graphene nanoribbons from carbon nanotubes. *Nature* 458, 877-880, (2009).

11 Sols, F., Guinea, F. & Neto, A. H. C. Coulomb Blockade in Graphene Nanoribbons. *Phys. Rev. Lett.* 99, 166803, (2007).

12 Yoon, Y. & Guo, J. Effect of edge roughness in graphene nanoribbon transistors. *Appl. Phys. Lett.* 91, 073103, (2007).

13 Obradovic, B. et al. Analysis of graphene nanoribbons as a channel material for field-effect transistors. *Appl. Phys. Lett.* 88, 142102, (2006).

14 Zhang, Y. et al. Direct observation of a widely tunable bandgap in bilayer graphene. *Nature* 459, 820-823, (2009).

15 Xia, F., Farmer, D. B., Lin, Y.-M. & Avouris, P. Graphene Field-Effect Transistors with High On/Off Current Ratio and Large Transport Band Gap at Room Temperature. *Nano Lett.* 10, 715-718, (2010).

16 Mak, K. F., Lee, C., Hone, J., Shan, J. & Heinz, T. F. Atomically Thin MoS2: A New Direct-Gap Semiconductor. *Phys. Rev. Lett.* 105, 136805, (2010).

17 Novoselov, K. S. et al. Two-dimensional atomic crystals. *PNAS* 102, 10451-10453, (2005).

18 Splendiani, A. et al. Emerging Photoluminescence in Monolayer MoS2. *Nano Lett.* 10, 1271-1275, (2010).

19 Banerjee, S., Richardson, W., Coleman, J. & Chatterjee, A. A new three-terminal tunnel device. *El. Dev. Lett., IEEE* 8, 347-349, (1987).

20 Han, M. Y., Ozyilmaz, B., Zhang, Y. B. & Kim, P. Energy band-gap engineering of graphene nanoribbons. *Phys. Rev. Lett.* 98, 206805, (2007).

21 Xia, F., Farmer, D. B., Lin, Y.-M. & Avouris, P. Graphene Field-Effect Transistors with High On/Off Current Ratio and Large Transport Band Gap at Room Temperature. *Nano Lett.* 10, 715-718, (2010).

22 Schwierz, F. Graphene transistors. *Nature Nanotech.* 5, 487-496, (2010).

23 Frindt, R. F. Single Crystals of MoS2 Several Molecular Layers Thick. *J. App. Phys.* 37, 1928-1929, (1966).

24 Joensen, P., Frindt, R. F. & Morrison, S. R. Single-Layer MoS2. *Mat. Res. Bull.* 21, 457-461, (1986).

25 Schumacher, A., Scandella, L., Kruse, N. & Prins, R. Single-layer MoS2 on mica: studies by means of scanning force microscopy. *Surf. Sci. Lett.* 289, L595-L598, (1993).
26 Kam, K. K. & Parkinson, B. A. Detailed photocurrent spectroscopy of the semiconducting group VIB transition metal dichalcogenides. *J. Phys. Chem.* 86, 463-467, (1982).
27 Feldman, Y., Wasserman, E., Srolovitz, D. J. & Tenne, R. High-Rate, Gas-phase grwth of MoS2 nested inorganic fullerenes and nanotubes. *Science* 267, 222-225, (1995).
28 Remskar, M. et al. Self-Assembly of Subnanometer-Diameter Single-Wall MoS2 Nanotubes. *Science* 292, 479-481, (2001).
29 Benameur, M., Radisavljevic, B., Sahoo, S., Berger, H. & Kis, A. Visibility of dichalcogenide nanolayers. *Cond-mat,* 1006.1048, (2010).
30 Ishigami, M., Chen, J. H., Cullen, W. G., Fuhrer, M. S. & Williams, E. D. Atomic Structure of Graphene on SiO2. *Nano Lett.* 7, 1643-1648, (2007).
31 Ayari, A., Cobas, E., Ogundadegbe, O. & Fuhrer, M. S. Realization and electrical characterization of ultrathin crystals of layered transition-metal dichalcogenides. *J. App. Phys.* 101, 014507, (2007).
32 Fivaz, R. & Mooser, E. Mobility of Charge Carriers in Semiconducting Layer Structures. *Physical Review* 163, 743-755, (1967).
33 Debdeep, J. & Aniruddha, K. Enhancement of Carrier Mobility in Semiconductor Nanostructures by Dielectric Engineering. *Phys. Rev. Lett.* 98, 136805, (2007).
34 Chen, F., Xia, J., Ferry, D. K. & Tao, N. Dielectric Screening Enhanced Performance in Graphene FET. *Nano Lett.* 9, 2571-2574, (2009).
35 Bohr, M. T., Chau, R. S., Ghani, T. & Mistry, K. The High-k Solution. *IEEE Spectrum* 44, 29-35, (October 2007).
36 Mistry, K. et al. A 45 nm Logic Technology with High-k+Metal Gate Transistors, Strained Silicon, 9 Cu Interconnect Layers, 193 nm Dry Patterning, and 100% Pb-free Packaging. *Tech. Dig. IEDM,* 247-250, (IEEE, 2007).
37 Lemme, M. C. A graphene field-effect device. *IEEE El. Dev. Lett.* 28, 282, (2007).
38 Fonoberov, V. A. & Balandin, A. A. Giant Enhancement of the Carrier Mobility in Silicon Nanowires with Diamond Coating. *Nano Lett.* 6, 2442-2446, (2006).
39 Bolotin, K. I. Ultrahigh electron mobility in suspended graphene. *Solid State Commun.* 146, 351-355, (2008).
40 Dean, C. R. et al. Boron nitride substrates for high-quality graphene electronics. *Nature Nanotech.* 5, 722-726, (2010).
41 Moser, J., Barreiro, A. & Bachtold, A. Current-induced cleaning of graphene. *Appl. Phys. Lett.* 91, 163513, (2007).
42 Gomez, L., Aberg, I. & Hoyt, J. L. Electron Transport in Strained-Silicon Directly on Insulator Ultrathin-Body n-MOSFETs With Body Thickness Ranging From 2 to 25 nm. *El. Dev. Lett., IEEE* 28, 285-287, (2007).
43 Duan, X. et al. High-performance thin-film transistors using semiconductor nanowires and nanoribbons. *Nature* 425, 274, (2003).
44 Liao, L. et al. High-speed graphene transistors with a self-aligned nanowire gate. *Nature* 467, 305-308, (2010).

Example 2

Integrated Circuits, Inverters and Logic Operations Based on a Single 2-Dimensional Layer of $MoS_2$ Logic circuits and the ability to amplify electrical signals form the functional back-bone of electronics along with the possibility to integrate multiple elements on the same chip. Here, we demonstrate that single-layer $MoS_2$, a two-dimensional semiconductor with a direct band gap of 1.8 eV (ref 13), has the capability to amplify signals and perform basic logic operations in simple integrated circuits composed of two $MoS_2$ transistors.[3] Our integrated circuit is composed of two n-type transistors realized on the same two-dimensional crystal of monolayer $MoS_2$, as schematically depicted on FIGS. 7(a) and (b).

Single-layer $MoS_2$ is a typical two-dimensional semiconductor from the layered transition metal dichalcogenide family. Single layers, 6.5 Å thick, can be extracted from bulk crystals using the micromechanical cleavage technique commonly associated with the production of graphene,[1, 14] lithium-based intercalation[15-16] or liquid phase exfoliation[17] and used as ready-made blocks for electronics.[3] Decreasing the number of layers in mesoscopic $MoS_2$ structures leads to a transformation from an indirect band gap semiconductor with a band gap of 1.2 eV (ref 18) into a direct gap semiconductor,[13, 19-21] with a band gap of 1.8 eV (ref 13) due to quantum confinement.[21] Being an ultrathin direct gap semiconductor, single-layer $MoS_2$ is very interesting as a material complementary to graphene which does not have a band gap in its pristine form. This makes it very difficult to fabricate logic circuits[22-23] or amplifiers[24] that would operate at room temperature with a voltage gain>1 which is necessary for incorporating such structures in electronic circuits. The presence of band-gap in single-layer $MoS_2$ on the other hand allows the realization of field-effect transistors with room-temperature on/off ratios that can exceed $10^8$ (ref. 3) which makes them interesting for building logic devices with low power dissipation. Recent simulations also predict that short channel single-layer $MoS_2$ devices could have higher on-current density than those based on Si,[25, 26] current on/off ratio higher than $10^{10}$, high degree of immunity to short channel effects[2, 27] and abrupt switching.[26] All these properties show that $MoS_2$ could be an interesting material for future applications in nanoelectronics.

We begin our integrated circuit fabrication by exfoliating single-layer $MoS_2$, FIG. 8(b), from bulk crystals using scotch-tape based micromechanical exfoliation,[1, 4] commonly used for the production of graphene. Monolayers of $MoS_2$ are deposited on degenerately doped Si substrates covered with 270 nm thick $SiO_2$, resulting in optimal contrast for optical detection of single-layers.[28] Three electrical leads are first fabricated using standard electron-beam lithography, followed by deposition of 90 nm thick Au electrodes and annealing in $Ar/H_2$ mixture[29] in order to remove resist residue and decrease contact resistance. The device is then covered by atomic layer deposition of 30 nm $HfO_2$, a high-κ material commonly used as a gate dielectric.[30-31] Finally, local top gates are deposited in the final round of e-beam lithography and metal deposition resulting in an integrated circuit such as the one shown on FIG. 8(b), composed of two single-layer transistors connected in series. The channel width of the transistors in our integrated circuit is 4.2 µm, lead spacing is 1.6 µm and top gate length is 1.3 µm.

Both transistors in our integrated circuit can be independently controlled by applying a voltage $V_{tg}$ to the corresponding top gate which is one of the crucial requirements for constructing integrated circuits composed of multiple transistors realized on the same substrate. We characterize both transistors in our integrated circuit at room temperature by connecting a pair of neighboring leads to the source and ground terminals of a semiconductor parameter analyzer and a voltage $V_{tg}$ to the corresponding top gate. The substrate is grounded throughout the measurements. The transfer characteristic for the transistor on the right side of the integrated circuit is shown on FIG. 8(c), and is typical of n-type field-effect transistors. By changing the top gate voltage $V_{tg}$ from −4V to +4V we can modify the current through the device over several orders of magnitude thanks to the high current on/off ratio of our transistor, higher than $10^6$ in this range of top-gate voltage $V_{tg}$. The on-resistance is 24 kΩ for $V_{ds}$=100 mV and $V_{tg}$=4 V. The linear and symmetric $I_{ds}$ vs $V_{ds}$ characteristics shown on FIG. 8(d) indicates that the contacts are ohmic. From back-gating characteristics, shown in the inset of FIG. 8(c), we estimate the two-contact low-field field effect mobility of ~320 cm$^2$/Vs. At the bias voltage $V_{ds}$=500 mV, the maximal measured on current is 22 μA (4.6 μA/μm), with $I_{on}/I_{off}$ higher than $10^6$ for the ±4 V range of $V_{tg}$ and an $I_{off}$~400 μA/μm.

The device transconductance defined as $g_m$=$dI_{ds}/dV_{tg}$ is 12 μS (2.6 μS/μm) for $V_{ds}$=500 mV and is comparable to CdS nanoribbon array transistors (2.5 μS/μm at $V_{ds}$=1 V).[32] High-performance top-gated graphene transistors can have normalized transconductance values[33] as high as 1.27 mS/μm while carbon nanotubes can reach transconductance of 2.3 mS/μm.[34] We expect that by lowering the channel length will reduce the number of scattering centers and increase the on current in MoS$_2$-based transistors. Theoretical models predict that MoS$_2$ transistors with a gate length of 15 nm would operate in the ballistic regime[25-26] with a maximum ON current as high as 1.6 mA/μm and a transconductance of 4 mS/um, both for $V_g$=0.6 V and a bias $V_{ds}$=0.5 V.[26]

The efficient channel switching for small voltages exhibited by our device is also clearly illustrated on Fig. (d) where we show the source-drain current $I_{ds}$ dependence on source-drain voltage $V_{ds}$ for different values of top gate voltage $V_{tg}$. This large degree of control at room-temperature is necessary for realizing logic operations with large voltage gain. For development of logic circuits based on new materials, a voltage gain >1 is necessary so that the output of one logic gate could be used to drive the input of the next gate without the need for signal restoration.

We proceed by demonstrating that our single-layer MoS$_2$ integrated circuit can operate as the most basic logic gate: a logic inverter, capable of converting a logical 0 (low input voltage) into logical 1 (high output voltage). We connect the middle lead to one of the local gates in a configuration depicted in the inset of FIG. 9(a), commonly used in logic circuits based on only one type (n or p) of transistors. In this configuration, the "lower" transistor acts as a switch while the "upper" one acts as an active load. Input voltage $V_{in}$ is applied to the local gate of the switch transistor while the supply voltage $V_{dd}$=2V is applied to the drain electrode of the load transistor. The output voltage and transfer characteristic of the inverter as a function of the input voltage $V_{in}$ is shown on FIG. 9(a).

For input voltages corresponding to logic 0, the switch transistor has a higher resistance than the load transistor and is effectively turned off. This results in a constant voltage at the output terminal which is close to the supply voltage of $V_{dd}$=2V applied to the load drain electrode. By increasing the input voltage above −1V, the lower FET becomes more conductive and the output voltage $V_{out}$ is now in the low range.

In the input voltage range of ±0.3 V, the output of the inverter is changing faster than the input, indicating that our device is capable of amplifying signals. The voltage gain defined as the negative of $dV_{out}/dV_{in}$ and plotted on FIG. 9(b) is higher than 4. For successful implementation of digital logic in electronic circuits based on any new nanomaterial, a voltage gain>1 is needed so that the output of one inverter could drive the input of the next inverter in the cascade. Our inverter has a voltage gain higher than 4 and is therefore suitable for integration in arrays of logic gates. This could involve level shifters because the input and output logic levels are not the same. Increasing the threshold voltage of MoS$_2$ transistors using for example substrate functionalization could also bring input and output voltages to the same level.

We note that to the best of our knowledge the maximal voltage gain for graphene-based inverters[22] demonstrated so far is 2-7 but at the temperature of 80K,[23,35] due to the low bandgap (<100 meV) in bilayer graphene which prohibits the use of such devices at room temperature.

Our monolayer MoS$_2$ transistors can also be used to perform logic operations involving two operands. By connecting two transistors in parallel and using an external resistor as load, we can construct a NOR gate, shown on the inset of FIG. 10, where we show the output voltage for all the possible input states of the NOR gate. When either one or both of the transistors are in the "on" state (corresponding to $V_{in}$=2V), the output is ~0V, corresponding to logical 0. Only when both transistors are in the "off" state, does the output become logical 1 ($V_{out}$≈$V_{dd}$=2V). NOR operation forms a functionally complete set of binary operations: every possibly logic operation (AND, OR, NAND etc.) can be realized using a network of NOR gates.

CONCLUSIONS

We have demonstrated here that single-layer MoS$_2$, a new two-dimensional semiconductor, can be used as the material basis for fabrication of integrated circuits and for performing logic operations with room-temperature characteristic suitable for integration. Our work represents the critical first step in the implementation of digital logic in two-dimensional materials at room temperature. Together with the possibility of large-scale liquid-based processing of MoS$_2$ and related 2D materials,[17] our finding could open the way to using MoS$_2$ for applications in flexible electronics. Single-layer MoS$_2$ also has advantages over conventional silicon: it is thinner than state of the art silicon films that are 2 nm thick[36] and has a smaller dielectric constant (∈=7, ref. 37) than silicon (∈=11.9), implying that using single-layer MoS$_2$ could reduce short channel effects[26] and result in smaller and less power-hungry transistors than those based on silicon technology. Several difficulties however need to be solved before MoS$_2$ could become a mainstream electronic material for the semiconductor industry. A method for large-scale growth of continuous monolayers of MoS$_2$ or a similar 2D semiconductor will be needed to fabricate more complex integrated circuits with a large number of elements.

MATERIALS AND METHODS

Single layers of MoS$_2$ are exfoliated from commercially available crystals of molybdenite (SPI Supplies Brand Moly Disulfide) using the scotch-tape micromechanical cleavage technique method pioneered for the production of graphene. AFM imaging is performed using the Asylum Research Cypher AFM. After Au contact deposition, devices are annealed in 100 sccm of Ar and 10 sccm H$_2$ flow at 200 C for 2 h.[29] ALD is performed in a commercially available system (Beneq) using a reaction of H$_2$O with tetrakis(ethylmethylamido)hafnium. Electrical characterization is carried out using National Instruments DAQ cards and a home-built shielded probe station with micromanipulated probes.

REFERENCES TO EXAMPLE 2

1. Novoselov, K. S.; Jiang, D.; Schedin, F.; Booth, T. J.; Khotkevich, V. V.; Morozov, S. V.; Geim, A. K., Two-Dimensional Atomic Crystals. *PNAS* 2005, 102, 10451-10453.
2. Schwierz, F., Graphene Transistors. *Nature Nanotech.* 2010, 5, 487-496.
3. Radisavljevic, B.; Radenovic, A.; Brivio, J.; Giacometti, V.; Kis, A., Single-Layer $MoS_2$ Transistors. *Nature Nanotech.* 2011, 6, 147-150.
4. Novoselov, K. S.; Geim, A. K.; Morozov, S. V.; Jiang, D.; Zhang, Y.; Dubonos, S. V.; Grigorieva, I. V.; Firsov, A. A., Electric Field Effect in Atomically Thin Carbon Films. *Science* 2004, 306, 666-669.
5. Bolotin, K. I.; Sikes, K. J.; Jiang, Z.; Klima, M.; Fudenberg, G.; Hone, J.; Kim, P.; Stormer, H. L., Ultrahigh Electron Mobility in Suspended Graphene. *Solid State Communications* 2008, 146, 351-355.
6. Novoselov, K. S.; Geim, A. K.; Morozov, S. V.; Jiang, D.; Katsnelson, M. I.; Grigorieva, I. V.; Dubonos, S. V.; Firsov, A. A., Two-Dimensional Gas of Massless Dirac Fermions in Graphene. *Nature* 2005, 438, 197-200.
7. Du, X.; Skachko, I.; Duerr, F.; Luican, A.; Andrei, E. Y., Fractional Quantum Hall Effect and Insulating Phase of Dirac Electrons in Graphene. *Nature* 2009, 462, 192-195.
8. Han, M. Y.; Ozyilmaz, B.; Zhang, Y. B.; Kim, P., Energy Band-Gap Engineering of Graphene Nanoribbons. *Phys. Rev. Lett.* 2007, 98, 206805.
9. Li, X.; Wang, X.; Zhang, L.; Lee, S.; Dai, H., Chemically Derived, Ultrasmooth Graphene Nanoribbon Semiconductors. *Science* 2008, 319, 1229-1232.
10. Zhang, Y.; Tang, T.-T.; Girit, C.; Hao, Z.; Martin, M. C.; Zettl, A.; Crommie, M. F.; Shen, Y. R.; Wang, F., Direct Observation of a Widely Tunable Bandgap in Bilayer Graphene. *Nature* 2009, 459, 820-823.
11. Xia, F.; Farmer, D. B.; Lin, Y.-m.; Avouris, P., Graphene Field-Effect Transistors with High on/Off Current Ratio and Large Transport Band Gap at Room Temperature. *Nano Lett.* 2010, 10, 715-718.
12. Sols, F.; Guinea, F.; Neto, A. H. C., Coulomb Blockade in Graphene Nanoribbons. *Phys. Rev. Lett.* 2007, 99, 166803.
13. Mak, K. F.; Lee, C.; Hone, J.; Shan, J.; Heinz, T. F., Atomically Thin $MoS_2$: A New Direct-Gap Semiconductor. *Phys. Rev. Lett.* 2010, 105, 136805.
14. Frindt, R. F., Single Crystals of $MoS_2$ Several Molecular Layers Thick. *J. App. Phys.* 1966, 37, 1928-1929.
15. Joensen, P.; Frindt, R. F.; Morrison, S. R., Single-Layer $Mos_2$. *Mat. Res. Bull.* 1986, 21, 457-461.
16. Schumacher, A.; Scandella, L.; Kruse, N.; Prins, R., Single-Layer $MoS_2$ on Mica: Studies by Means of Scanning Force Microscopy. *Surf Sci. Lett.* 1993, 289, L595-L598.
17. Coleman, J. N.; Lotya, M.; O'Neill, A.; Bergin, S. D.; King, P. J.; Khan, U.; Young, K.; Gaucher, A.; De, S.; Smith, R. J., et al., Two-Dimensional Nanosheets Produced by Liquid Exfoliation of Layered Materials. *Science* 2011, 331, 568-571.
18. Kam, K. K.; Parkinson, B. A., Detailed Photocurrent Spectroscopy of the Semiconducting Group Vib Transition Metal Dichalcogenides. *J. Phys. Chem.* 1982, 86, 463-467.
19. Lebegue, S.; Eriksson, O., Electronic Structure of Two-Dimensional Crystals from Ab Initio Theory. *Phys. Rev. B* 2009, 79, 115409.
20. Splendiani, A.; Sun, L.; Zhang, Y.; Li, T.; Kim, J.; Chim, C.-Y.; Galli, G.; Wang, F., Emerging Photoluminescence in Monolayer $MoS_2$. *Nano Lett.* 2010, 10, 1271-1275.
21. Kuc, A.; Zibouche, N.; Heine, T., How Does Quantum Confinement Influence the Electronic Structure of Transition Metal Sulfides $Tms_2$. *Cond-mat* 2011, 1104.3670.
22. Traversi, F.; Russo, V.; Sordan, R., Integrated Complementary Graphene Inverter. *Appl. Phys. Lett.* 2009, 94, 223312.
23. Li, S.-L.; Miyazaki, H.; Kumatani, A.; Kanda, A.; Tsukagoshi, K., Low Operating Bias and Matched Input-Output Characteristics in Graphene Logic Inverters. *Nano Lett.* 2010, 10, 2357-2362.
24. Yang, X.; Liu, G.; Balandin, A. A.; Mohanram, K., Triple-Mode Single-Transistor Graphene Amplifier and Its Applications. *ACS Nano* 2010, 4, 5532-5538.
25. Liu, L.; Kumar, S. B.; Ouyang, Y.; Guo, J., Performance Limits of Monolayer Transition Metal Dichalcogenide Transistors. *IEEE Trans. El. Dev.* 2011, 58, 3042-3047.
26. Yoon, Y.; Ganapathi, K.; Salahuddin, S., How Good Can Monolayer $MoS_2$ Transistors Be? *Nano Lett.* 2011, 11, 3768-3773.
27. Schwierz, F., Nanoelectronics: Flat Transistors Get Off the Ground. *Nature Nanotech.* 2011, 6, 135-136.
28. Benameur, M. M.; Radisavljevic, B.; Heron, J. S.; Sahoo, S.; Berger, H.; Kis, A., Visibility of Dichalcogenide Nanolayers. *Nanotechnology* 2011, 22, 125706.
29. Ishigami, M.; Chen, J. H.; Cullen, W. G.; Fuhrer, M. S.; Williams, E. D., Atomic Structure of Graphene on Sio2. *Nano Lett.* 2007, 7, 1643-1648.
30. Bohr, M. T.; Chau, R. S.; Ghani, T.; Mistry, K., The High-K Solution. *IEEE Spectrum October* 2007, 44, 29-35.
31. Mistry, K.; Allen, C.; Auth, C.; Beattie, B.; Bergstrom, D.; Bost, M.; Brazier, M.; Buehler, M.; Cappellani, A.; Chau, R., et al., A 45 nm Logic Technology with High-K+Metal Gate Transistors, Strained Silicon, 9 Cu Interconnect Layers, 193 nm Dry Patterning, and 100% Pb-Free Packaging. *Tech. Dig. IEDM* 2007, 247-250.
32. Duan, X.; Niu, C.; Sahi, V.; Chen, J.; Parce, J. W.; Empedocles, S.; Goldman, J. L., High-Performance Thin-Film Transistors Using Semiconductor Nanowires and Nanoribbons. *Nature* 2003, 425, 274-278.
33. Liao, L.; Lin, Y.-C.; Bao, M.; Cheng, R.; Bai, J.; Liu, Y.; Qu, Y.; Wang, K. L.; Huang, Y.; Duan, X., High-Speed Graphene Transistors with a Self-Aligned Nanowire Gate. *Nature* 2010, 467, 305-308.
34. Wind, S. J.; Appenzeller, J.; Martel, R.; Derycke, V.; Avouris, P., Vertical Scaling of Carbon Nanotube Field-Effect Transistors Using Top Gate Electrodes. *Appl. Phys. Lett.* 2002, 80, 3817.
35. Li, S.-L.; Miyazaki, H.; Lee, M. V.; Liu, C.; Kanda, A.; Tsukagoshi, K., Complementary-Like Graphene Logic Gates Controlled by Electrostatic Doping. *Small* 2011.
36. Gomez, L.; Aberg, I.; Hoyt, J. L., Electron Transport in Strained-Silicon Directly on Insulator Ultrathin-Body N-Mosfets with Body Thickness Ranging from 2 to 25 Nm. *El. Dev. Lett., IEEE* 2007, 28, 285-287.
37. Frindt, R. F.; Yoffe, A. D., Physical Properties of Layer Structures: Optical Properties and Photoconductivity of Thin Crystals of Molybdenum Disulphide. *Proceedings of the Royal Society of London. Series A. Mathematical and Physical Sciences* 1963, 273, 69-83.

The invention claimed is:

1. A semiconductor device comprising:
   a source electrode;
   a drain electrode;
   a semiconducting layer consisting of a single 2-dimensional layer made from one of the following materials: $MoS_2$, $MoSe_2$, $WS_2$, $WSe_2$, $MoTe_2$ or $WTe_2$;
   a gate electrode, wherein said gate electrode extends over said source electrode and said drain electrode; and
   a dielectric layer placed between said semiconducting layer and said gate electrode, wherein said dielectric layer is configured to form a protective layer on said semiconducting layer.

2. Semiconductor device according to claim 1 devoid of a top gate electrode and a top dielectric layer.

3. Sensor based on a semiconductor device according to claim 2.

4. Semiconductor device according to claim 1 comprising a second gate electrode.

5. Semiconductor device according to claim 4 wherein said second gate electrode is embedded within an oxide layer.

6. Semiconductor device according to claim 1, wherein said semiconducting layer is a nanosized layer.

7. Semiconductor device according to claim 6 wherein said semiconducting layer is between 0.5 and 1.5 nm thick.

8. Semiconductor device according to claim 1, wherein at least one of said electrodes is made of graphene.

9. Semiconductor device according to claim 1, wherein said dielectric layer is made of $HfO_2$.

10. Transistor comprising a semiconductor device according to claim 1.

11. Digital inverter comprising a semiconductor device according to claim 1.

12. A semiconductor device comprising:
    a source electrode;
    a drain electrode;
    a first gate electrode;
    a second gate electrode;
    a semiconducting layer consisting of a single 2-dimensional layer made from one of the following materials: $MoS_2$, $MoSe_2$, $WS_2$, and $WSe_2$; and
    a dielectric layer placed between said semiconducting layer and said first gate electrode; and dielectric later being configured to protect said semiconducting layer.

13. A semiconductor device according to claim 12 wherein said first gate electrode is extending over said source electrode and said drain electrode.

14. A semiconductor device according to claim 12 wherein said first gate electrode is embedded within said dielectric layer.

15. A sensor based on the semiconductor device according to claim 12.

16. A semiconductor device according to claim 12 wherein said second gate electrode is embedded within an oxide layer.

17. A semiconductor device according to claim 12, wherein said semiconducting layer is a nanosized layer.

18. A semiconductor device according to claim 17 wherein said semiconducting layer is between 0.5 and 1.5 nm thick.

19. A semiconductor device according to claim 12, wherein at least one of said electrodes is made of graphene.

20. A semiconductor device according to claim 12, wherein said dielectric layer is made of $HfO_2$.

21. A transistor comprising the semiconductor device according to claim 12.

22. A digital inverter comprising the semiconductor device according to claim 12.

23. A semiconductor device comprising:
    a source electrode;
    a drain electrode;
    a semiconducting layer comprising two or fewer 2-dimensional layers made from one of the following materials: $MoS_2$, $MoSe_2$, $WS_2$, $WSe_2$, $MoTe_2$ or $WTe_2$;
    a gate electrode, wherein said gate electrode extends over said source electrode and said drain electrode;
    a dielectric layer placed between said semiconducting layer and said gate electrode, wherein said dielectric layer is configured to form a protective layer on said semiconducting layer; and
    a second gate electrode, wherein said second gate electrode is embedded within an oxide layer.

24. Semiconductor device according to claim 23, wherein at least one of said electrodes is made of graphene and wherein said dielectric layer is made of $HfO_2$.

25. A semiconductor device comprising:
    a source electrode;
    a drain electrode;
    a semiconducting layer consisting of a single 2-dimensional layer made from one of the following materials: $MoS_2$, $MoSe_2$, $WS_2$, $WSe_2$, $MoTe_2$ or $WTe_2$;
    a gate electrode, wherein said gate electrode is embedded within a dielectric layer; and
    said dielectric layer placed between said semiconducting layer and said gate electrode, wherein said dielectric layer is configured to form a protective layer on said semiconducting layer.

26. The semiconductor device of claim 25, wherein the device is devoid of a top gate electrode and a top dielectric layer.

27. A sensor based on a semiconductor device according to claim 25.

28. The semiconductor device of claim 25, further comprising a second gate electrode.

29. The semiconductor device of claim 25, wherein said second gate electrode is embedded within an oxide layer.

30. A semiconductor device comprising:
    a source electrode;
    a drain electrode;
    a gate electrode;
    a semiconducting layer consisting of a single 2-dimensional layer made from one of the following materials: $MoS_2$, $MoSe_2$, $WS_2$, and $WSe_2$; and
    a dielectric layer placed between said semiconducting layer and said gate electrode, wherein said dielectric layer is made of a high dielectric constant dielectric layer.

* * * * *

UNITED STATES PATENT AND TRADEMARK OFFICE
CERTIFICATE OF CORRECTION

PATENT NO.        : 9,608,101 B2
APPLICATION NO.   : 13/976757
DATED             : March 28, 2017
INVENTOR(S)       : Kis et al.

It is certified that error appears in the above-identified patent and that said Letters Patent is hereby corrected as shown below:

In the Claims

Claim 12, Column 17, Line 44: Replace "electrode; and dielectric later" with "electrode, said dielectric layer"

Signed and Sealed this
Second Day of May, 2017

Michelle K. Lee
*Director of the United States Patent and Trademark Office*